United States Patent [19]

Nelson et al.

[11] Patent Number: 4,953,002

[45] Date of Patent: Aug. 28, 1990

[54] SEMICONDUCTOR DEVICE HOUSING WITH MAGNETIC FIELD PROTECTION

[75] Inventors: Keith W. Nelson, St. Louis Park; James E. Lenz, Brooklyn Park, both of Minn.; Takeshi Kawai, Kanagawa, Japan

[73] Assignee: Honeywell Inc., Minneapolis, Minn.

[21] Appl. No.: 404,003

[22] Filed: Sep. 5, 1989

Related U.S. Application Data

[63] Continuation of Ser. No. 175,702, Mar. 31, 1988, abandoned.

[51] Int. Cl.$^5$ .................... H01L 29/46; H01L 23/06
[52] U.S. Cl. ........................ 357/74; 357/27; 357/84; 174/52.3; 365/53; 365/209
[58] Field of Search ...................... 357/27, 74, 84

[56] References Cited

U.S. PATENT DOCUMENTS

| | | |
|---|---|---|
| 2,463,778 | 3/1949 | Kellog . |
| 2,488,710 | 11/1949 | Cooper . |
| 3,271,638 | 9/1966 | Murad . |
| 3,341,102 | 9/1967 | Stephens et al. . |
| 3,390,226 | 6/1968 | Beyerlein . |
| 3,469,017 | 9/1969 | Starger . |
| 3,500,440 | 3/1970 | Hastings . |
| 3,546,362 | 12/1970 | Berger . |
| 3,614,546 | 1/1970 | Avins . |
| 3,648,108 | 3/1972 | Bailey . |
| 3,684,464 | 8/1972 | Happ et al. .................... 357/70 |
| 3,786,444 | 1/1974 | Sly .................................. 365/53 |
| 3,809,233 | 5/1974 | Gruszka . |
| 3,820,152 | 6/1974 | Booth . |
| 4,004,194 | 1/1977 | Doerflinger et al. . |
| 4,209,848 | 6/1980 | Braun et al. .................... 365/53 |
| 4,323,405 | 4/1982 | Uno et al. ....................... 357/84 |
| 4,327,832 | 5/1982 | deMatteo . |
| 4,331,285 | 5/1982 | Gottwals . |
| 4,370,700 | 1/1983 | Duddles et al. . |
| 4,412,093 | 10/1983 | Wildeboer . |
| 4,539,621 | 9/1985 | Currier . |
| 4,567,317 | 1/1986 | Enrlich et al. . |
| 4,575,747 | 3/1986 | Fritz . |
| 4,592,015 | 5/1986 | Akiba et al. . |
| 4,630,095 | 12/1986 | Otsuka et al. . |

FOREIGN PATENT DOCUMENTS

| | | | |
|---|---|---|---|
| 56-51076 | 5/1981 | Japan .................... 365/53 |
| 60-186040 | 9/1985 | Japan .................... 357/84 |

OTHER PUBLICATIONS

Bertin, IBM T.D.B., vol. 8, No. 3, Aug. 85, p. 441, "Magnetic Film Storage Configuration".

"Magnetic Permeable and Adhesive Joined Shield Structures", IEEE Transactions on Magnetics, vol. MAG-13, No. 5, Sep. 1977, W. J. DeBontie and A. D. Butherus, Bell Laboratories.

"Magnetically Permeable Adhesives and Adhesive-Joined Shield Structure", I.E.E.E. Transactions on Magnetics, vol. MAG. 13, No. 5, Sep. 1977, W. J. LeBonte and A. D. Butherus.

Primary Examiner—Jerome Jackson, Jr.
Attorney, Agent, or Firm—Kinney & Lange

[57] ABSTRACT

A housing for integrated circuit structures containing magnetic thin film which has permeable protective layers parallel thereto.

5 Claims, 1 Drawing Sheet

SEMICONDUCTOR DEVICE HOUSING WITH MAGNETIC FIELD PROTECTION

This is a continuation of application Ser. No. 07/175,702, now abandoned, filed Mar. 31, 1988.

BACKGROUND OF THE INVENTION

1. Field of the Invention.

The present invention relates to housings for semiconductor devices and, more particularly, to housings for semiconductor devices having magnetic materials used therein which are to be protected from external magnetic fields.

Recently, the use of material layers which have high magnetic permeability in monolithic integrated circuits has provided a basis for magnetic field sensors and for magnetic cell memories. Typically, such a magnetically permeable layer is formed of a thin film of a metallic alloy composition which, as an example, might comprise nickle, cobalt and iron.

Such permeable thin films are fabricated in the course of the fabrication procedure for monolithic integrated circuits with some added steps, and are often provided by vacuum deposition methods, though other methods can be used. The films so fabricated usually exhibit uniaxial anisotropy, magnetoresistance, and are usually chosen with such a composition of the foregoing elements that there is little magnetostriction.

Because very large demagnetizing fields would otherwise result, the magnetization of such thin films will always lie substantially in the plane of the film, that is, the magnetization vector for the material will be substantially in the plane of the film. The orientation of the easy axis of magnetization can be chosen if the film is deposited in the presence of a magnetic field oriented in the selected direction.

In integrated circuit devices having such permeable thin films, the orientation of the magnetization vector in the plane is usually important to the operation of the device. In accord with thermodynamics, the magnetization in such a film will arrange itself to minimize the magnetic energy. Fields external to the film will often be generated in and about the device as part of the device operation. These fields must be oriented to have components in the plane of the magnetic thin films to have a significant effect on the magnetization of such films in accord with minimizing the magnetic energy. Fields perpendicular to the films will have no effect on such magnetization.

On the other hand, for those magnetic fields which are generated from sources external to the film and to the integrated circuit device and its housing, there will be a desire in many instances that part or all of them have no significant effect on these permeable films. This is particularly true in the case of memory devices where the information contained in the memory is contained in the orientations of the magnetization vectors of the magnetic material used in each memory cell. Any such external magnetic field effects which would alter the orientations of the magnetization vectors in the memory cells could contribute to a loss of information or to erroneous information being provided by the memory.

Thus, such films need to be protected from external magnetic field disturbances but the integrated circuit structures must also be housed in such a way to minimize cost if they are to remain a viable product for the memory market. Therefore, a housing to protect such integrated circuit structures from significant external adverse influences, including external magnetic fields, and which can be economically provided, would be desirable.

SUMMARY OF THE INVENTION

The present invention provides an integrated circuit structure housing containing a pair of spaced apart layers, each of a high magnetic permeability, and with the integrated circuit structure located therebetween having its magnetic material magnetization vectors parallel to such spaced apart layers.

DETAILED DESCRIPTION OF THE PREFERRED EMBODIMENTS

Figure 1:
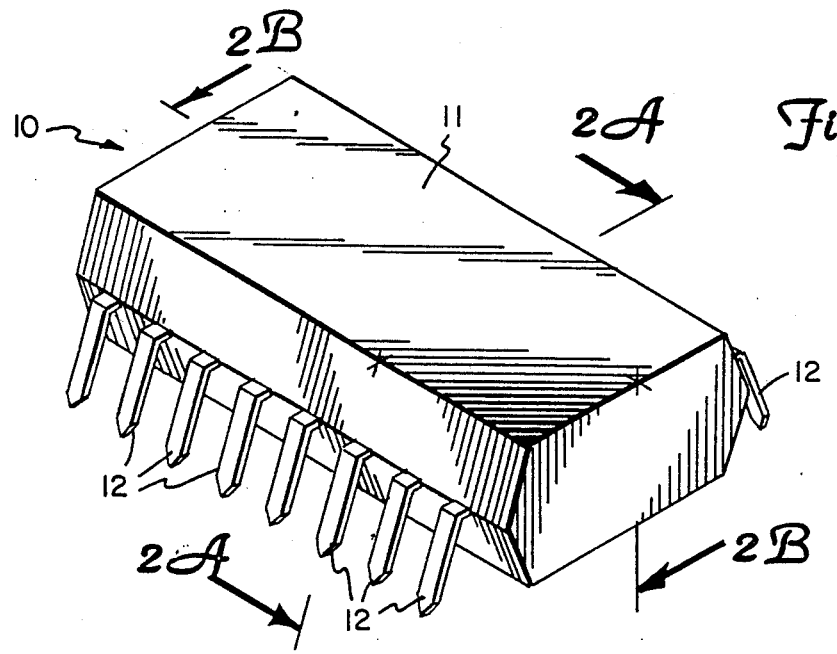
FIG. 1 shows an integrated circuit structure housing.

FIG. 1 shows a "packaged" integrated circuit device, 10. The "package" or housing is formed by injecting any one of various well known plastic compounds into a mold around that which is to be housed including the leads and the integrated circuit device. This device is usually a monolithic integrated circuit but could be a hybrid integrated circuit. Although a molded plastic housing is provided for the integrated circuit structure in this example, other housing types may be used in connection with housing the structures of the present invention.

Housed device 10 has, as indicated, a molded plastic body, 11. Protruding out from either side thereof are electrically conductive leads, 12, which are available external to body 11 to permit interconnection of device 10 into a larger circuit assembly. Fabrication processes for making such a molded body 11 to house an integrated circuit and its external leads and other structures to result in a housed device 10 are well known.

A housed device in a system like device 10 can be subjected to many different magnetic fields acting at different strengths and in different orientations. However, permeable magnetic material thin film layers in the integrated circuit structures are generally constructed parallel to a plane, a plane which, as indicated above, also contains the magnetization vector for that material film. Since, again as indicated above, only fields in such a plane can affect the magnetization vectors in the materials, only those external magnetic fields parallel to that plane need be protected against in the structure of housed device 10. An arrangement for doing this is shown in FIGS. 2A and 2B, each of which are a cross section view taken of housed device 10 in FIG. 1, as indicated there, which housed device contains further protective structure.

A monolithic integrated circuit chip structure, 13, is shown supported at a major surface thereof on a metal support pad, 14. Integrated circuit chip 13 has at least one magnetic thin film portion therein, and for a memory chip typically thousands of such portions, with the film portion or portions being substantially contained in a plane which is parallel to the upper and lower major surfaces of integrated circuit chip 13. Thus, such magnetic thin film portion or portions extend parallel to support pad 14.

Figure 2A:
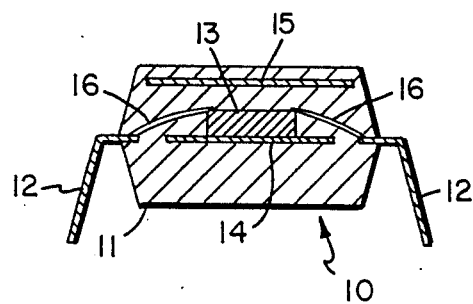
FIGS. 2A and 2B show cross section views of the housing of FIG. 1.
Figure 2B:
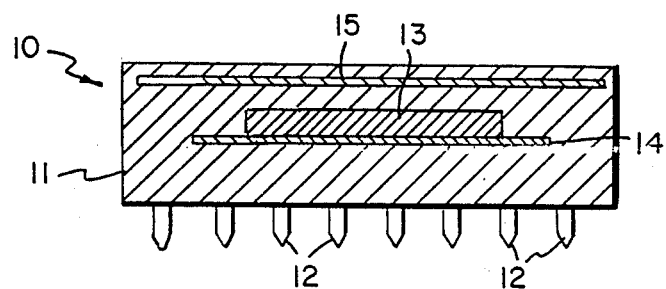

Further shown in FIGS. 2A and 2B are an upper shield layer, 15. Shield 15 is provided in housed device 10 in molded body 11 parallel to support pad 14. In addition, as can be seen in FIG. 2A, electrically conductive interconnection wires, 16, are shown extending from interconnection pads or regions in integrated circuit chip structure 13 to corresponding ones of conductive leads 12.

Each of support pad 14 and shield 15 is formed of a metal having a relatively high permeability, at least several times that of air or silicon. One such metal which is well known for use in magnetic shielding has a high initial permeability, and is known as the alloy mumetal having approximately 77% nickel, 4.8% copper, 1.5% chromium and 14.9% iron. Such an alloy is usually hydrogen annealed to provide its high initial permeability. Other satisfactorily high permeability metals are available from several sources and are well known under such designations as Alloy 42, Hypernik, etc.

The resulting structure has the magnetic thin film in integrated circuit chip 13 substantially parallel to both support pad 14 and shield layer 15 which, of course, are also parallel to one another. As a result of this arrangement, magnetic field portions oriented toward the sides of chip 13, and so in the plane of the magnetic film portions therein, will tend to pass through support pad 14 and shield 15 rather than through chip 13 because of the high permeability of this pair of layers on either side of chip 13. If each of these layers extends well past chip 13 or at least past the magnetic thin film portions provided in the chip, and are positioned as close to one another as possible while keeping chip 13 between them, very little fringing of portions of the magnetic field will occur in chip 13 as opposed to being in the permeable material pair of layers 14 and 15.

On the other hand, magnetic field portions which are oriented perpendicular to pad 14 and shield layer 15 will pass through integrated circuit chip structure 13 to a substantial extent and without significant deviation in direction or magnitude from what they would be in the absence of the housed chip. However, as already indicated, such magnetic fields are not in the plane of the magnetic thin film portion or portions used in integrated circuit chip structure 13, and so will not significantly affect the magnetization vectors of such film portion or portions. Thus, no shield structures along the sides of integrated circuit chip structure 13 between its major surfaces need be provided to protect against such perpendicular magnetic field portions, and the cost of forming an enclosed magnetic shield can, in this situation, be avoided.

To further reduce cost and ease the fabrication process, support pad 14 and leads 12 can all be formed in a common lead frame so that they are the same material, that is, a material which is both electrically conductive and of a high magnetic permeability such as mumetal. A further possibility is to form upper shield 15 in the same lead material and have it bent to the position shown in FIGS. 2A and 2B.

Although the present invention has been described with reference to preferred embodiments, workers skilled in the art will recognize that changes may be made in form and detail without departing from the spirit and scope of the invention.

What is claimed is:

1. A housing for protecting a selected integrated circuit structure contained therein, said integrated circuit structure having therein at least one magnetizable material with its magnetization orientation confined substantially to a plane as a magnetization plane, said housing comprising:

a pair of spaced apart layers each formed of a relatively high magnetic permeability material positioned substantially parallel to said magnetization plane between which said integrated circuit structure is secured with each of said layers extending parallel to said magnetization plane to an extent greater than does said magnetizable material in said integrated circuit structure, said housing between said layers being substantially free of magnetic material that is oriented to extend substantially perpendicular to said magnetization plane, and said housing being free of any substantially permanent magnetic materials other than in said integrated circuit structure; and a plurality of conductive leads extending past said pair of layers such that portions thereof are externally available, said integrated circuit structure having interconnection regions therein each electrically connected to a selected one of said plurality of conductive leads.

2. The apparatus of claim 1 wherein one of said pair of layers extends to a greater extent parallel to said magnetization plane than does that one remaining of said pair.

3. The apparatus of claim 1 where one of said pair of spaced apart layers is, with substantial portions of each of said conductive leads, in a plane as a layer plane, those portions of said conductive leads being electrically connected to said interconnection regions.

4. The apparatus of claim 3 wherein said conductive leads are formed of that same high magnetic permeability material as is that one of said pair of layers which is substantially in said layer plane with portions of said conductive leads.

5. The apparatus of claim 3 wherein said integrated circuit structure, said pair of layers, and said conductive lead portions which are in said layer plane with one of said layers have substantially all of those spaces occurring between them impregnated with an electrical insulating material.

* * * * *